United States Patent
Miyagi et al.

(10) Patent No.: US 7,269,399 B2
(45) Date of Patent: Sep. 11, 2007

(54) RECEIVER OF DOUBLE CONVERSION SYSTEM WITH ANTENNA TUNING WITH VARIABLE CAPACITANCE USING DIGITAL-TO-ANALOG CONVERTER HAVING TEMPERATURE COEFFICIENT SETTING SECTION

(75) Inventors: Hiroshi Miyagi, Jouetsu (JP); Hiroshi Katsunaga, Kariya (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 42 days.

(21) Appl. No.: 10/533,777

(22) PCT Filed: Oct. 14, 2003

(86) PCT No.: PCT/JP03/13108

§ 371 (c)(1),
(2), (4) Date: May 3, 2005

(87) PCT Pub. No.: WO2004/042945

PCT Pub. Date: May 21, 2004

(65) Prior Publication Data
US 2006/0068743 A1    Mar. 30, 2006

(30) Foreign Application Priority Data
Nov. 6, 2002    (JP)    ............................. 2002-322618

(51) Int. Cl.
*H04B 1/18*    (2006.01)
(52) U.S. Cl. ............................. 455/193.1; 455/193.3; 455/562.1; 455/191.2; 343/745; 343/750

(58) Field of Classification Search ................ 455/131, 455/193.1, 193.2, 193.3, 189.1, 190.1, 191.1, 455/265, 188.2, 573, 575.1, 550.1, 425, 424, 455/561, 456.5, 456.6, 19, 67.11, 562.1, 121, 455/173.1, 197.2, 274, 135, 192.1, 191.2; 343/788, 742, 745, 750, 860, 702, 895; 327/113, 327/552, 207, 419, 478, 330, 565; 333/134, 333/139

See application file for complete search history.

(56) References Cited

U.S. PATENT DOCUMENTS

| 4,326,296 A | * | 4/1982 | Rafter et al. ............. 455/188.2 |
| 4,491,978 A | * | 1/1985 | Nagata et al. ............. 455/338 |
| 4,862,516 A | * | 8/1989 | Macnak et al. .......... 455/193.1 |

(Continued)

FOREIGN PATENT DOCUMENTS

| JP | 63-077275 | 4/1988 |
| JP | 05-043629 U | 6/1993 |
| JP | 10-173565 | 6/1998 |
| JP | 2000-174653 | 6/2000 |
| JP | 2002-319846 | 10/2002 |

*Primary Examiner*—Edward F. Urban
*Assistant Examiner*—Charles Chow
(74) *Attorney, Agent, or Firm*—James H. Walters

(57) ABSTRACT

A receiver of double conversion system wherein unwanted components included in received signals can be removed without fail and wherein the number of constituent parts has been reduced. The receiver comprises an antenna tuning circuit 10 including a tuning coil 11 and a variable-capacitance diode 13; a high frequency amplification circuit 20 for performing a high frequency amplification of a signal outputted by the antenna tuning circuit 10; two-stage mixing circuits 22, 28 for performing two frequency conversions of an output from the high frequency amplification circuit 20; and a detecting circuit 36 for detecting an output from the latter-stage mixing circuit 28.

10 Claims, 4 Drawing Sheets

U.S. PATENT DOCUMENTS

| | | | |
|---|---|---|---|
| 5,301,358 A * | 4/1994 | Gaskill et al. | 455/193.2 |
| 5,428,829 A * | 6/1995 | Osburn et al. | 455/197.1 |
| 5,585,751 A * | 12/1996 | Iizuka | 327/113 |
| 5,745,844 A * | 4/1998 | Kromer et al. | 455/193.1 |
| 6,239,760 B1 * | 5/2001 | Van Voorhies | 343/742 |
| 6,795,128 B2 * | 9/2004 | Yamamoto | 348/729 |
| 6,867,745 B2 * | 3/2005 | Dunn et al. | 343/788 |
| 7,079,195 B1 * | 7/2006 | Birleson et al. | 348/725 |
| 2002/0065539 A1 * | 5/2002 | Von Arx et al. | 607/60 |
| 2002/0107054 A1 * | 8/2002 | Fujisawa et al. | 455/573 |
| 2004/0116091 A1 * | 6/2004 | McGinn | 455/193.1 |
| 2006/0145918 A1 * | 7/2006 | Henderson et al. | 342/359 |

* cited by examiner

RECEIVER OF DOUBLE CONVERSION SYSTEM WITH ANTENNA TUNING WITH VARIABLE CAPACITANCE USING DIGITAL-TO-ANALOG CONVERTER HAVING TEMPERATURE COEFFICIENT SETTING SECTION

TECHNICAL FIELD

The present invention relates to a receiver of double conversion system for performing frequency conversion two times.

BACKGROUND ART

A receiver of double conversion system for performing frequency conversion two times for a received broadcast wave by using two mixing circuits is conventionally known (for example, see pages 2 to 3, FIGS. 1 to 4 of Japanese Patent Laid-Open No. 2000-174653). The first stage mixing circuit converts the broadcast wave to a higher frequency signal so as to enable image interference to be easily removed, as a result of which excellent interference characteristics can be realized with a non-tuning type receiver without an antenna tuning circuit and an RF tuning circuit.

In the above-described patent gazette document, a prior art is also disclosed in which the reception sensitivity and the interference characteristic are further improved in the receiver of double conversion system by making a signal obtained by applying high frequency amplification to a broadcast wave received with an antenna tuned before the signal is inputted to the first stage mixing circuit. The tuning of the signal before it is inputted to the first stage mixing circuit makes it possible to prevent a radio wave of a broadcasting station whose reception is not desired and a noise from entering the first stage mixing circuit.

In the receiver disclosed in Japanese Patent Laid-Open No. 2000-174653 described above, however, since the signal received via the antenna is made to pass the tuning circuit after being subjected to the high frequency amplification, there is a problem in that unwanted components such as a radio wave of a broadcasting station whose reception is not desired and a noise, when included in the signal received by the antenna, are also amplified. In the above-described receiver in which the tuning circuit is configured by combining a tuning coil with a variable-capacitance diode, the antenna is also separately provided. For example, a rod antenna is generally used as the antenna, but in this case, there is a problem in that both the rod antenna and the tuning coil are needed, causing the number of components to be increased.

DISCLOSURE OF THE INVENTION

The present invention has been made in view of the above-described circumstances. An object of the present invention is to provide a receiver of double conversion system capable of surely removing unwanted components included in a received signal, and of reducing the number of components.

In order to solve the above-described problem, according to the present invention, there is provided a receiver of double conversion system comprising: an antenna tuning circuit including a tuning coil and a variable-capacitance diode; a high frequency amplification circuit for performing high frequency amplification for a signal outputted from the antenna tuning circuit; first and second mixing circuits for performing frequency conversion twice for an output of the high frequency amplification circuit; and a detecting circuit for performing detection processing for an output of the mixing circuits. The double conversion system adopted and the antenna tuning circuit provided in a former stage of the high frequency amplification circuit make it possible to surely remove unwanted components, such as a radio wave of an undesired broadcasting station and a noise, etc. which are included in the received broadcast wave. Since the tuning coil in the antenna tuning circuit can be used as an antenna, as compared with the case where the tuning circuit is provided for a subsequent stage of high frequency amplification circuit, the coil for tuning and the antenna need not be provided separately, so that the number of components can be reduced.

The above-described first mixing circuit also preferably converts a frequency of a signal outputted from the high frequency amplification circuit to a frequency higher than the frequency of the broadcast wave, and the second mixing circuit preferably converts a frequency of a signal outputted from the first mixing circuit to a frequency lower than the frequency of the broadcast wave, thereby enabling image interference included in the received broadcast wave to be easily removed.

The above-described tuning coil included in the antenna tuning circuit is also preferably a bar antenna in which a conducting wire is wound around a magnetic core. The bar antenna, which is capable of suppressing to minimum the fluctuation of magnetic flux due to the effect of a human body, etc. present in the vicinity, makes it possible to stably receive the broadcast wave. The use of a ferrite core having a large magnetic permeability also makes it possible to obtain a large electromotive voltage, thereby enabling the reception sensitivity to be improved.

The above-described tuning coil included in the antenna tuning circuit is also preferably a loop antenna in which a conducting wire is wound in a loop shape. The loop antenna can be easily formed by using a casing of a portable receiver, etc.

The receiver according to the present invention also preferably comprises: a digital-analog converter for generating a control voltage for setting a tuning frequency applied to a variable-capacitance diode included in the above-described antenna tuning circuit; a local oscillator for inputting a local oscillation signal whose frequency is variable to the first mixing circuit to which the output signal of the high frequency amplification circuit is inputted; and a control section for setting the frequency of the local oscillation signal outputted from the local oscillator, and for generating a frequency setting data required for associating the tuning frequency of the antenna tuning circuit with the frequency of the local oscillation signal, so as to input the frequency setting data to the digital-analog converter. In the receiver of double conversion system, in which a frequency of an intermediate frequency signal outputted from the first mixing circuit is often set near 10 MHz, in the case where the frequency of the broadcast wave (about 500 to 1600 kHz in the case of AM broadcasting) is greatly different from the frequency of the intermediate frequency signal, it is difficult to change the oscillation frequency of the local oscillator and the tuning frequency of the antenna tuning circuit in the same way only by adding a padding capacitor, etc., as a result of which a tracking error exceeds a permissible range. However, in the case where the control voltage applied to the variable-capacitance diode is generated by using the digital-analog converter, the tuning frequency can be set arbitrarily regardless of the oscillation frequency of the local oscillator, so that the excessive tracking error can be prevented from occurring.

The above-described digital-analog converter also preferably allows the control voltage to change with a predetermined temperature coefficient in accordance with ambient temperature. Thereby, expensive components such as the temperature compensating capacitor need not be used, so that component costs can be reduced.

The above-described digital-analog converter also preferably comprises a temperature coefficient setting section constituted by including elements having predetermined temperature coefficients, so as to allow a device constant of the temperature coefficient setting section as a whole to be changed in accordance with ambient temperature. In this way, the provision of the temperature coefficient setting section for a part of the digital-analog converter enables the temperature characteristic of the digital-analog converter as a whole to be arbitrarily set within a predetermined range.

It is also preferred that the above-described digital-analog converter, the high frequency amplification circuit, the first and second mixing circuits, the detecting circuit and the local oscillator are formed on a same semiconductor substrate, that the temperature coefficient setting section includes a plurality of resistances which are formed by a semiconductor manufacturing process and which have temperature coefficients different to each other, and that a connection form of the plurality of resistances is set so as to make the temperature coefficient of the digital-analog converter as a whole reach a predetermined value. Specifically, each of the plurality of resistances is preferably formed by a poly-silicon on a semiconductor substrate, so that the temperature coefficient of each resistance is made to be different by adjusting impurity concentration and carrier types of the poly-silicon. Alternatively, each of the plurality of resistances is preferably formed by utilizing a p-type region or a n-type region on a semiconductor substrate, so that the temperature coefficient of each resistance is made to be different by adjusting impurity concentration and carrier types of the p-type region or the n-type region. In this way, most of the components including the digital-analog converter can be formed on a semiconductor substrate, thereby effecting cost reduction in facilitating manufacturing and in reducing the number of components.

The above-described digital-analog converter preferably comprises a current source of which current value is set in accordance with a value of inputted frequency setting data, and the temperature coefficient setting section into which the current generated by the current source flows, so as to output a voltage across the temperature coefficient setting section as the control voltage. Such configuration of the digital-analog converter facilitates changing of the output voltage of the digital-analog converter (control voltage) in accordance with the temperature coefficient of the temperature coefficient setting section.

BEST MODE FOR CARRYING OUT THE INVENTION

Hereafter, a receiver of an embodiment in which a double conversion system according to the present invention is adopted will be described with reference to the accompanying drawings.

Figure 1:
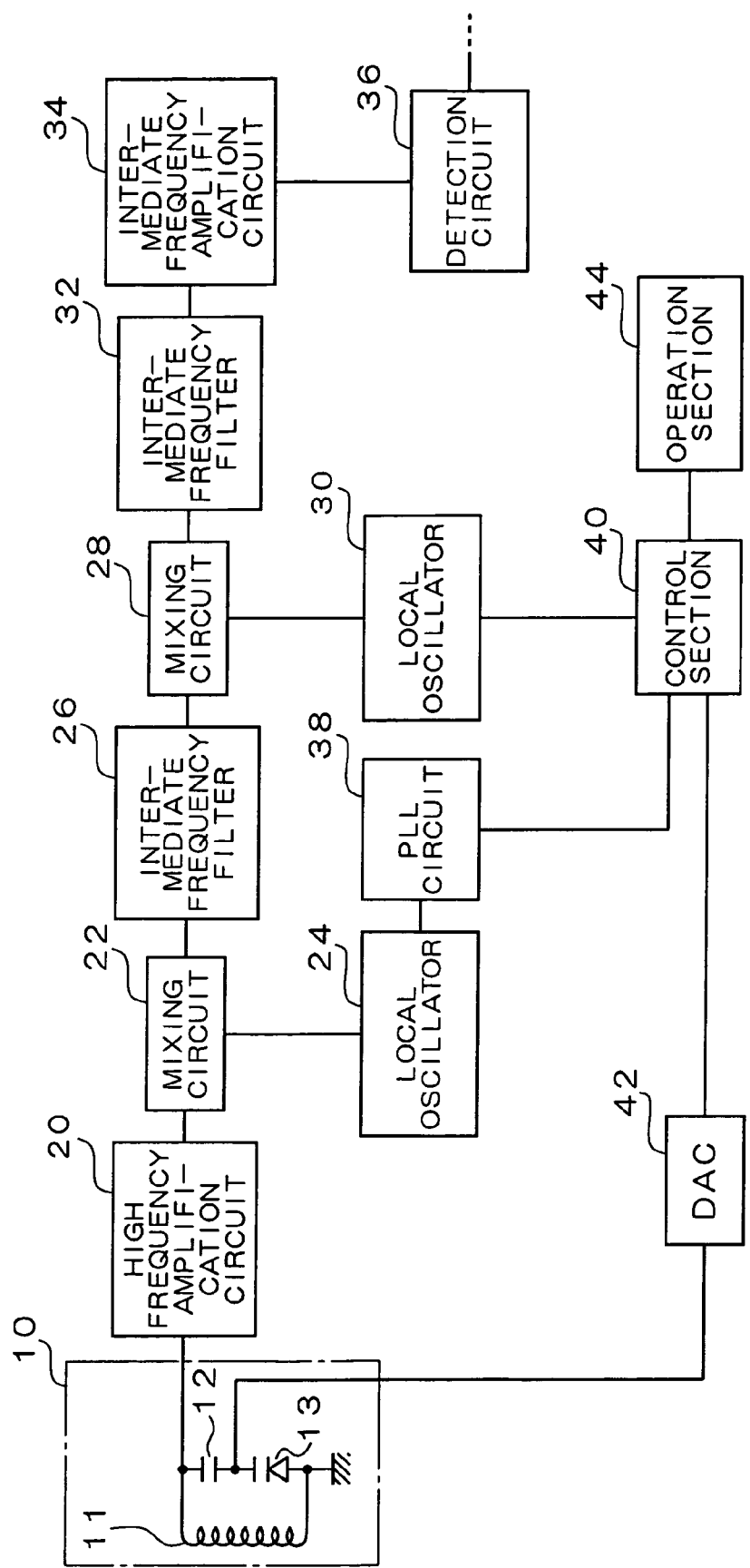
FIG. 1 is a figure showing a configuration of a receiver according to a first embodiment.

FIG. 1 is a figure showing a configuration of a receiver according to a first embodiment. The receiver of double conversion system according to the first embodiment shown in FIG. 1 is constituted by including an antenna tuning circuit 10, a high frequency amplification circuit 20, mixing circuits 22, 28, local oscillators 24, 30, intermediate frequency filters 26, 32, an intermediate frequency amplification circuit 34, a detecting circuit 36, a PLL circuit 38, a control section 40, a DAC (digital-analog converter) 42, and an operation section 44.

The antenna tuning circuit 10 is constituted by a tuning coil 11, a capacitor 12 and a variable-capacitance diode 13. The tuning coil 11 and the variable-capacitance diode 13 are connected in parallel, and their parallel resonance frequency is made to match with a frequency of a broadcast wave desired to be received, thereby making radio waves of other broadcasting stations other than the desired broadcast wave and other noises, etc. attenuated. A capacitor 12 is provided for applying a control voltage of reverse bias across the variable-capacitance diode 13. A bar antenna in which a conducting wire is wound around a magnetic core, or a loop antenna in which a conducting wire is wound in a loop shape is used as the tuning coil 11. In the case where the bar antenna is used as the tuning coil 11, the fluctuation of magnetic flux due to the effect of a human body present in the vicinity can be suppressed to minimum, so that the broadcast wave can be stably received. The use of a ferrite core having a large magnetic permeability as the magnetic core, also enables a large electromotive voltage to be obtained, thereby improving the reception sensitivity. In the case where the loop antenna is used as the tuning coil 11, the loop antenna can be easily formed by using a casing of a portable receiver, etc.

The high frequency amplification circuit 20 performs high frequency amplification for a signal outputted from the antenna tuning circuit 10. The mixing circuit 22 (a first mixing circuit) mixes a signal outputted from the high frequency amplification circuit 20 with a local oscillation signal outputted from the local oscillator 24. If the frequency of the signal outputted from the high frequency amplification circuit 20 is f1 and the frequency of the local oscillation signal is f2, signals having frequency components of (f2±f1) are outputted from the mixing circuit 22.

The intermediate frequency filter 26 passes only a predetermined frequency component of a signal outputted from the mixing circuit 22. For example, the center frequency of the pass band is set to 10.7 MHz, and the broadcast wave in which (f2−f1) becomes 10.7 MHz is selected by the intermediate frequency filter 26. That is, in the case where the broadcast wave of frequency f1 is desired to be received, the frequency of the local oscillation signal inputted to the mixing circuit 22 from the local oscillator 24 may be set to (f1+10.7 MHz).

The mixing circuit 28 (a second mixing circuit) mixes a signal outputted from the intermediate frequency filter 26 with a local oscillation signal outputted from the local oscillator 30. If the frequency of the signal outputted from the intermediate frequency filter 26 is f3 (=10.7 MHz) and the frequency of the local oscillation signal outputted from the local oscillator 30 is f4, signals of frequency components of (f3±f4) are outputted from the mixing circuit 28.

The intermediate frequency filter 32 passes only a predetermined frequency component of a signal outputted from the mixing circuit 28. For example, the center frequency of the pass band is set to 450 kHz, and the component in which (f3−f4) becomes 450 kHz is selected by the intermediate frequency filter 32.

In this way, the frequency of the signal outputted from the high frequency amplification circuit 20 is converted to a frequency higher than the frequency of the broadcast wave by the former-stage mixing circuit 22. In addition, the frequency of the signal outputted from the former-stage mixing circuit 22 is converted to a frequency lower than the frequency of the broadcast wave by the latter-stage mixing circuit 28.

The intermediate frequency amplification circuit 34 amplifies an intermediate frequency signal of 450 kHz outputted from the intermediate frequency filter 32. The detecting circuit 36 applies a predetermined detection processing, for example, an AM detection processing, to the intermediate frequency signal which has been amplified by the intermediate frequency amplification circuit 34, so as to output a voice signal.

The local oscillator 24 generates the local oscillation signal of frequency f2 (=f1−10.7 MHz) to be inputted to the first stage mixing circuit 22. The PLL circuit 38 constituting a frequency synthesizer together with the local oscillator 24, enables the oscillation frequency of the local oscillator 24 to be set by a predetermined step, by means of the division ratio of a variable frequency divider (not shown) in the PLL circuit 38 being changed by the control section 40. As a result, when the broadcast frequency of AM broadcasting is assumed to be set at an interval of 9 kHz for am example, it is possible to set the reception frequency equal to the broadcast frequency.

The local oscillator 30 generates the local oscillation signal of the frequency f4 (=10.25 MHz) to be inputted to the second-stage mixing circuit 28. Since the frequency f3 (=10.7 MHz) of the signal outputted from the intermediate frequency filter 26 is fixed, the fixed oscillation frequency f4 is set in the local oscillator 30.

The control section 40 changes the oscillation frequency of the local oscillator 24, and also changes the tuning frequency of the antenna tuning circuit 10. However, in the present embodiment, since the reception frequency band (about 500 to 1600 kHz) of AM broadcasting is greatly different from the frequency (about 10 MHz) of the local oscillation signal generated by the local oscillator 24, only the use of a padding capacitor etc. is not sufficient to prevent the tracking error from exceeding a permissible range, when the control voltage generated by the PLL circuit 38 is applied as it is to the variable-capacitance diode 13 in the antenna tuning circuit 10. For this reason, the control section 40 inputs to the DAC 42 a frequency setting data required for setting an accurate tuning frequency corresponding to the oscillation frequency of the local oscillator 24, so as to enable a control voltage corresponding to the setting data to be generated by the DAC 42. The tuning circuit of the antenna tuning circuit 10 is set so as to settle the tracking error within the permissible range by applying the control voltage thus generated to the variable-capacitance diode 13.

The operation section 44 is provided in order that the user of the receiver performs channel selection instruction etc., and contents of the user's operation are sent to the control section 40.

As described above, the receiver according to the present embodiment, in which the double conversion system is adopted, and in which the antenna tuning circuit 10 is provided in the former stage of the high frequency amplification circuit 20, is there by capable of surely removing unwanted components, such as a radio wave of an undesired broadcasting station and a noise, etc. which are included in the received broadcast wave. Since the tuning coil 11 in the antenna tuning circuit 10 can be used as an antenna, as compared with the case where the tuning circuit is provided for a subsequent stage of high frequency amplification circuit, the coil for tuning and the antenna need not be provided separately, so that the number of components can be reduced.

Figure 2:
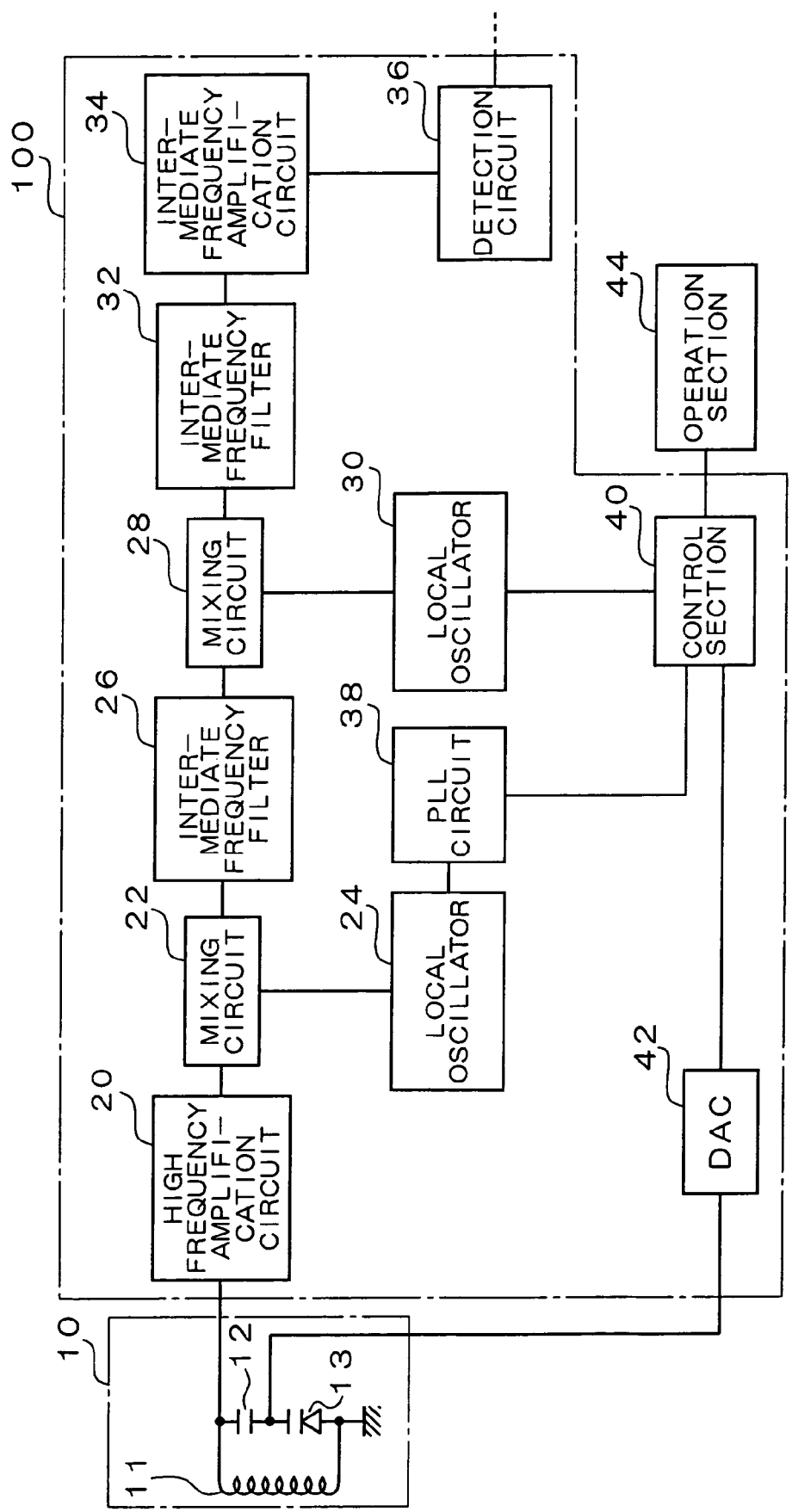
FIG. 2 is a figure showing a configuration of a receiver according to a second embodiment.

FIG. 2 is a figure showing a configuration of a receiver according to a second embodiment. The receiver of double conversion system according to the second embodiment shown in FIG. 2 is different from the receiver according to the first embodiment in that the high frequency amplification circuit 20, the mixing circuits 22, 28, the local oscillators 24, 30, the intermediate frequency filters 26, 32, the intermediate frequency amplification circuit 34, the detecting circuit 36, the PLL circuit 38, the control section 40, and the DAC 42, which are shown in FIG. 1, are realized by a semiconductor device 100 formed on a same semiconductor substrate, and in that the DAC 42 has a temperature coefficient and the control voltage, which is an output of the DAC 42, changes in accordance with ambient temperature.

Figure 3:
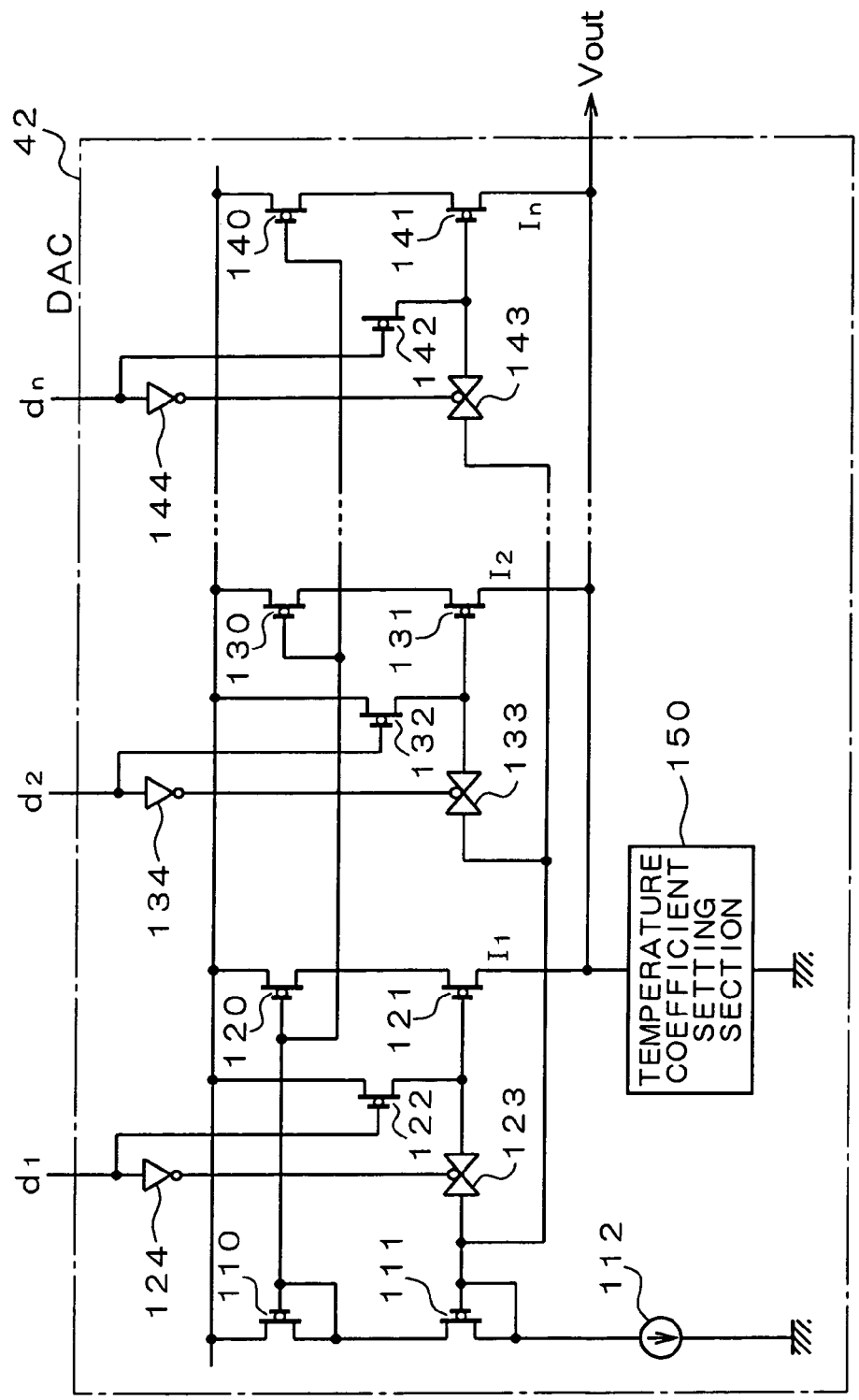
FIG. 3 is a figure showing a detailed configuration of DAC.

FIG. 3 is a figure showing a detailed configuration of the DAC 42. As shown in FIG. 3, the DAC 42 is constituted by including FETs 110, 111, 120, 121, 122, 130, 131, 132, 140, 141, 142, a current source 112, analog switches 123, 133, . . . , 143, inverter circuits 124, 134, . . . , 144 and a temperature coefficient setting section 150.

A first current mirror circuit is constituted by using the FETs 110, 111, the current source 112, the FETs 120, 121, and the validity/invalidity of operation of the first current mirror circuit are controlled by a switching circuit constituted by the inverter circuit 124, the FET 122 and the analog switch 123. The first current mirror circuit corresponds to the first bit $d_1$ of input data of the DAC 42. Since both the analog switch 123 and the FET 122 are turned on when the first bit $d_1$ is "1", i.e. the signal inputted to the inverter circuit 124 is at a high-level, the operation of the first current mirror circuit is effective for allowing a predetermined current $I_1$ to flow.

Also, a second current mirror circuit is constituted by using the FETs 110, 111, the current source 112 and the FETs 130, 131, and the validity/invalidity of operation of the second current mirror circuit is controlled by a switching circuit constituted by the inverter circuit 134, the FET 132 and the analog switch 133. The second current mirror circuit corresponds to the second bit $d_2$ of input data of the DAC 42. Since both the analog switch 133 and the FET 132 are turned on when the second bit $d_2$ is "1", i.e. the signal inputted to the inverter circuit 134 is at a high-level, the operation of the second current mirror circuit is effective for allowing a predetermined current $I_2$ to flow.

Similarly, an n-th current mirror circuit is constituted by using the FETs 110, 111, the current source 112 and the FETs 140, 141, and the validity/invalidity of operation of the n-th current mirror circuit is controlled by a switching circuit constituted by the inverter circuit 144, the FET 142 and the analog switch 143. The n-th current mirror circuit corresponds to the n-th bit $d_n$ of input data of the DAC 42. Since both the analog switch 143 and the FET 142 are turned on when the n-th bit $d_n$ is "1", i.e. the signal inputted to the inverter circuit 144 is at a high-level, the operation of the n-th current mirror circuit is effective for allowing a predetermined current $I_n$ to flow.

In present embodiment, among n-bit data inputted to the DAC 42, the first bit $d_1$ corresponds to the least significant bit, and the n-th bit $d_n$ corresponds to the most significant bit. If the current $I_1$ generated by the first current mirror circuit is defined as 1, the gate width (channel width) W and the gate length (channel length) L of each FET are set so that the currents $I_2$, $I_3$, ... $I_n$ generated by the second, the third, ... and the n-th current mirror circuits become twice ($=2^1$), four ($=2^2$) times, ..., $2^{(n-1)}$ times the current $I_1$.

The above-described first to n-th current mirror circuits are connected in parallel so as to form a current source, and when two or more current mirrors operate simultaneously, each of the current generated by the plurality of current mirror circuits is added together. Accordingly, it is possible to generate a current corresponding to the value of input data by selectively operating the above-described first to n-th current mirror circuits in correspondence with the value of each bit of the input data. The current thus generated is supplied to the temperature coefficient setting section 150.

The temperature coefficient setting section 150 is a combined resistance constituted by combining a plurality of resistances, each having a different temperature coefficient, and a device constant (resistance value) of the combined resistance as a whole changes in accordance with ambient temperature. It is generally known that the temperature coefficient of the resistance which is formed on a semiconductor substrate by a semiconductor manufacturing process can be easily differentiated to about three kinds of temperature coefficient by devising kinds and concentration of impurity. For example, in the case where the resistance is formed with a poly-silicon on a semiconductor substrate, the temperature coefficient from – several thousands to + several hundreds ppm/° C. can be easily realized by adjusting impurity concentration and carrier types (p-type or n-type). Alternatively, the diffusion resistance of a p-type region or an n-type region formed on a semiconductor substrate is utilized instead of the poly-silicon, and the temperature coefficient from – several thousands to + several hundreds ppm/° C. can be easily realized by adjusting impurity concentration and carrier types. In view of the case where three kinds of resistances R1, R2, R3 whose temperature coefficients are largely different can be formed on a semiconductor substrate, the temperature coefficient of the temperature coefficient setting section 150 as a whole can be freely set within a predetermined range by devising values and connection methods of the three kinds of resistances R1 to R3.

Figure 4:
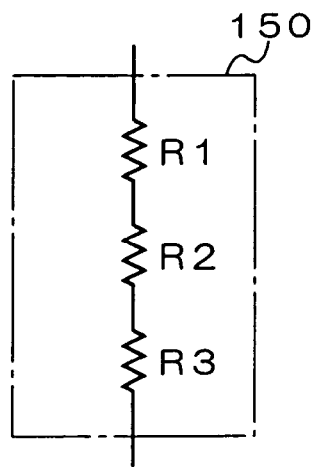
FIG. 4 is a figure showing a configuration of a temperature coefficient setting section in which three kinds of resistances are connected in series.

FIG. 4 is a figure showing a configuration of the temperature coefficient setting section 150 in which three kinds of resistances are connected in series. When each resistance value of three kinds of resistances R1 to R3 are defined as $r_1$, $r_2$, $r_3$, and each temperature coefficient of the three kinds of resistances R1 to R3 are defined as $a_1$, $a_2$, $a_3$, the temperature coefficient $b_1$ of the temperature coefficient setting section 150 shown in FIG. 4 as a whole is expressed as follows.

$$b_1=(a_1r_1+a_2r_2+a_3r_3)/(r_1+r_2+r_3)$$

When a current supplied to the temperature coefficient setting section 150 is defined as I, the output voltage $V_{out}$ of the DAC 42 appearing at one end of the temperature coefficient setting section 150 is expressed as follows.

$$V_{out}=(r_1+r_2+r_3) I$$

The output voltage $V_{out}$ fluctuates by $\Delta V=(a_1r_1+a_2r_2+a_3r_3) I$, when ambient temperature is changed by 1° C.

Figure 5:
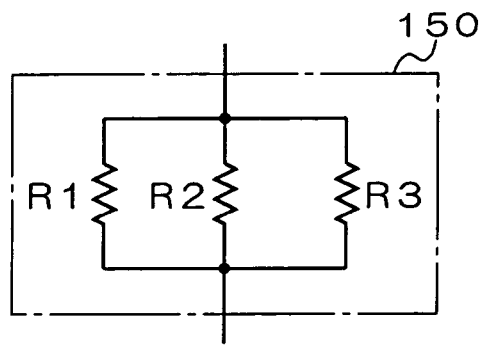
FIG. 5 is a figure showing a configuration of the temperature coefficient setting section in which three kinds of resistances are connected in parallel.

FIG. 5 is a figure showing a configuration of the temperature coefficient setting section 150 in which three kinds of resistances are connected in parallel. The temperature coefficient $b_2$ of the temperature coefficient setting section 150 shown in FIG. 5 as a whole is expressed as follows.

$$b_2=a_1a_2a_3(r_1r_2+r_2r_3+r_3r_1)/(a_1a_2r_1r_2+a_2a_3r_2r_3+a_3a_1r_3r_1)$$

The output voltage $V_{out}$ of the DAC 42 appearing at one end of the temperature coefficient setting section 150 is expressed as follows.

$$V_{out}=r_1r_2r_3I/(r_1r_2+r_2r_3+r_3r_1)$$

The output voltage $V_{out}$ fluctuates by $\Delta V=a_1a_2a_3r_1r_2r_3I/(a_1a_2r_1r_2+a_2a_3r_2r_3+a_3a_1r_3r_1)$, when ambient temperature is changed by 1° C.

Figure 6:
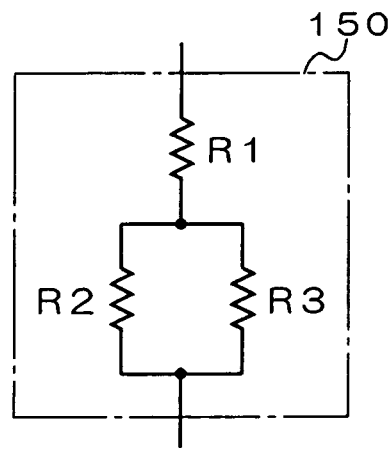
FIG. 6 is a figure showing a configuration of the temperature coefficient setting section in which three kinds of resistances are connected in series and in parallel.

FIG. 6 is a figure showing a configuration of the temperature coefficient setting section 150 in which the three kinds of resistances are connected in series and in parallel. The temperature coefficient $b_3$ of the temperature coefficient setting section 150 shown in FIG. 6 as a whole is expressed as follows.

$$b_3=(a_1r_1+a_2a_3r_2r_3/(a_2r_2+a_3r_3))/(r_1+r_2r_3/(r_2+r_3))$$

The output voltage $V_{out}$ of the DAC 42 appearing at one end of the temperature coefficient setting section 150 is expressed as follows.

$$V_{out}=(r_1+r_2r_3/(r_2+r_3)) I$$

The output voltage $V_{out}$ fluctuates by $\Delta V=(a_1r_1+a_2a_3r_2r_3/(a_2r_2+a_3r_3)) I$, when ambient temperature is changed by 1° C.

As described above, the DAC 42 included in the semiconductor device 100 according to the present embodiment is provided with the temperature coefficient setting section 150 having a predetermined temperature coefficient, so that the temperature characteristic of the DAC 42 as whole can be set arbitrarily within a predetermined range. In particular, since the voltage across the temperature coefficient setting section 150 generated when the current generated by the current source constituted by connecting the plurality of current mirror circuits flows into the temperature coefficient setting section 150, is arranged to be the output voltage of the DAC 42, the output voltage of the DAC 42 can be easily changed in accordance with the temperature coefficient of the temperature coefficient setting section 150. Thereby, even if the data inputted from the control section 40 is fixed, when ambient temperature changes, the output voltage $V_{out}$ is arranged to change in accordance with the ambient temperature.

Further, the temperature coefficient can be set arbitrarily to some extent by changing connection methods of the three kinds of resistances R1 to R3 in the temperature coefficient setting section 150, or by changing each temperature coefficient of the resistances R1 to R3. Accordingly, when the voltage applied by the PLL circuit 38 to the local oscillator 24 changes in accordance with ambient temperature, the output voltage of the DAC 42 can also be changed similarly, thereby enabling the expansion of tracking error resulting from the temperature change to be prevented.

The DAC 42 and the antenna tuning circuit 10 according to the present embodiment are also constituted without using expensive components, such as the temperature compensating capacitor, so that component costs can be reduced. Further, the temperature coefficient setting section 150 in the DAC 42 can be realized by controlling kinds and concentration of impurities by using semiconductor processes, such as a CMOS process or a MOS process, so that the components for temperature compensation can be formed on a semiconductor substrate. For this reason, in the case where each component constituting the receiver shown in FIG. 2 is formed on a semiconductor substrate, external components can be reduced so as to effect further cost reduction in facilitating manufacturing and in reducing the number of components.

The present invention is not limited to the above-described embodiments, and various variations are possible within the scope and spirit of the invention. For example, although the DAC 42 for generating a current in accordance with a value of each bit of input data is explained in the second embodiment described above, the present invention may also be applied to a receiver, etc. in which a DAC using other method, for example, DAC of R-2R resistance type or load resistor type, etc. is used. In these cases, the temperature coefficient setting section 150 may be comprised in a power supply for generating a predetermined operating voltage, so as to change in accordance with ambient temperature the value of the operating voltage generated by the power supply. This method may also be applied to the current-type DAC 42 shown in FIG. 3. That is, in FIG. 3, the temperature coefficient setting section 150 may be replaced by a resistance having a fixed resistance value, and a power supply which includes the temperature coefficient setting section 150, and of which output voltage is changed in accordance with ambient temperature, may be provided so as to apply the output voltage of the power supply to each drain of the FETs 110, 120, 130, . . . , 140.

Although the case where the temperature coefficient setting section 150 included in the DAC 42 is constituted by combining three kinds of resistances R1 to R3 having different temperature coefficients is explained in the above-described second embodiment, in the case where four or more kinds of resistances having different temperature coefficients can be formed by changing kinds and concentration of impurities which are added by diffusion and implantation in a semiconductor process, the temperature coefficient setting section 150 may also be constituted by combining these four or more kinds of resistances. Alternatively, in the case where a predetermined temperature coefficient can be obtained by combining two kinds of resistances, or by using a kind of resistance, the temperature coefficient setting section 150 may be arranged to be constituted by using two kinds of resistances or a kind of resistance.

Although the temperature coefficient of the DAC 42 as a whole is made to reach a desired value by devising combination of resistances in the temperature coefficient setting section 150, in the case where each component other than the temperature coefficient setting section 150 in the DAC 42 has a temperature coefficient which can not be neglected, the temperature coefficient of the temperature coefficient setting section 150 may also be set so as to allow the temperature coefficient of the DAC 42 as a whole, including these components and the temperature coefficient setting section 150, to reach a predetermined value.

Although the antenna tuning circuit 10 having the resonance circuit in which the resonance coil 11 and the variable-capacitance diode 13 are connected in parallel is explained in the above-described embodiments, the resonance circuit in which these elements are connected in series may also be arranged to be included.

INDUSTRIAL APPLICABILITY

As described above, the receiver according to the present invention, in which the double conversion system is adopted, and in which the antenna tuning circuit is provided in the former stage of the high frequency amplification circuit, is thereby capable of surely removing unwanted components, such as a radio wave of an undesired broadcasting station and a noise, etc. which are included in the received broadcast wave. Since the tuning coil in the antenna tuning circuit can be used as an antenna, as compared with the case where the tuning circuit is provided for a subsequent stage of high frequency amplification circuit, the coil for tuning and the antenna need not be provided separately, so that the number of components can be reduced.

The invention claimed is:

1. A receiver of double conversion system comprising:
an antenna tuning circuit including a tuning coil and a variable-capacitance diode;
a high frequency amplification circuit for performing high frequency amplification for a signal outputted from said antenna tuning circuit;
first and second mixing circuits for performing frequency conversion twice for an output of said high frequency amplification circuit;
a detecting circuit for performing detection processing for an output of said second mixing circuit;
a digital-analog converter for generating a control voltage for setting a tuning frequency applied to said variable-capacitance diode included in said antenna tuning circuit;
a local oscillator for inputting a local oscillation signal whose frequency is variable to said first mixing circuit to which an output signal of said high frequency amplification circuit is inputted; and
a control section for setting the frequency of the local oscillation signal outputted from said local oscillator, and for generating a frequency setting data required for associating the tuning frequency of said antenna tuning circuit with the frequency of the local oscillation signal, and for inputting the frequency setting data to said digital-analog converter,
wherein said digital-analog converter comprises a temperature coefficient setting section constituted by including elements having predetermined temperature coefficients,
wherein a device constant of said temperature coefficient setting section as a whole is changed in accordance with ambient temperature,
wherein said digital-analog converter, said high frequency amplification circuit, said first and second mixing circuits, said detecting circuit and said local oscillator are formed on a same semiconductor substrate
wherein said temperature coefficient setting section includes a plurality of resistances which are formed by a semiconductor manufacturing process and which have temperature coefficients different to each other, and wherein a connection form of said plurality of resistances is set so that a temperature coefficient of said digital-analog converter reaches a predetermined value.

2. The receiver of double conversion system according to claim 1, wherein said first mixing circuit converts a frequency of a signal outputted from said high frequency amplification circuit to a frequency higher than a frequency of a broadcast wave, and wherein said second mixing circuit converts a frequency of a signal outputted from said first mixing circuit to a frequency lower than the frequency of the broadcast wave.

3. The receiver of double conversion system according to claim 1, wherein said tuning coil included in said antenna tuning circuit is a bar antenna in which a conducting wire is wound around a magnetic core.

4. The receiver of double conversion system according to claim 1, wherein said tuning coil included in said antenna tuning circuit is a loop antenna in which a conducting wire is wound in a loop shape.

5. The receiver of double conversion system according to claim 1, wherein each of said plurality of resistances is formed by a poly-silicon on a semiconductor substrate, and wherein the temperature coefficients of the resistances are made to be different by adjusting impurity concentration and carrier types of said poly-silicon.

6. The receiver of double conversion system according to claim 1, wherein each of said plurality of resistances is formed by utilizing a p-type region or a n-type region on a semiconductor substrate, and wherein the temperature coefficients of the resistances are made to be different by adjusting impurity concentration and carrier types of said p-type region or said n-type region.

7. A receiver of double conversion system comprising:

an antenna tuning circuit including a tuning coil and a variable-capacitance diode;

a high frequency amplification circuit for performing high frequency amplification for a signal outputted from said antenna tuning circuit;

first and second mixing circuits for performing frequency conversion twice for an output of said high frequency amplification circuit;

a detecting circuit for performing detection processing for an output of said second mixing circuit;

a digital-analog converter for generating a control voltage for setting a tuning frequency applied to said variable-capacitance diode included in said antenna tuning circuit;

a local oscillator for inputting a local oscillation signal whose frequency is variable to said first mixing circuit to which an output signal of said high frequency amplification circuit is inputted; and a control section for setting the frequency of the local oscillation signal outputted from said local oscillator, and for generating a frequency setting data required for associating the tuning frequency of said antenna tuning circuit with the frequency of the local oscillation signal, and for inputting the frequency setting data to said digital-analog converter, wherein said digital-analog converter comprises a temperature coefficient setting section constituted by including elements having predetermined temperature coefficients, wherein a device constant of said temperature coefficient setting section as a whole is changed in accordance with ambient temperature, wherein said digital-analog converter, said high frequency amplification circuit, said first and second mixing circuits, said detecting circuit and said local oscillator are formed on a same semiconductor substrate, wherein said digital-analog converter comprises: a current source of which current value is set in accordance with a value of said inputted frequency setting data; and said temperature coefficient setting section into which the current generated by the current source flows, and wherein a voltage across said temperature coefficient setting section is outputted as said control voltage.

8. The receiver of double conversion system according to claim 7, wherein said first mixing circuit converts a frequency of a signal outputted from said high frequency amplification circuit to a frequency higher than a frequency of a broadcast wave, and wherein said second mixing circuit converts a frequency of a signal outputted from said first mixing circuit to a frequency lower than the frequency of the broadcast wave.

9. The receiver of double conversion system according to claim 7, wherein said tuning coil included in said antenna tuning circuit is a bar antenna in which a conducting wire is wound around a magnetic core.

10. The receiver of double conversion system according to claim 7, wherein said tuning coil included in said antenna tuning circuit is a loop antenna in which a conducting wire is wound in a loop shape.

* * * * *